(12) United States Patent
Hageraats et al.

(10) Patent No.: US 12,381,519 B2
(45) Date of Patent: Aug. 5, 2025

(54) BROADBAND LOW NOISE AMPLIFIER USING MULTIPLE CASCODE STAGES

(71) Applicant: SKYWORKS SOLUTIONS, INC., Irvine, CA (US)

(72) Inventors: Johannes Jacobus Emile Maria Hageraats, Kamuela, HI (US); Junhyung Lee, Irvine, CA (US); Rimal Deep Singh, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 369 days.

(21) Appl. No.: 17/815,319

(22) Filed: Jul. 27, 2022

(65) Prior Publication Data

US 2023/0030709 A1 Feb. 2, 2023

Related U.S. Application Data

(60) Provisional application No. 63/226,251, filed on Jul. 28, 2021.

(51) Int. Cl.
*H03F 3/19* (2006.01)
*H03F 1/56* (2006.01)
*H04B 1/40* (2015.01)

(52) U.S. Cl.
CPC .................. *H03F 3/19* (2013.01); *H03F 1/56* (2013.01); *H04B 1/40* (2013.01); *H03F 2200/294* (2013.01); *H03F 2200/387* (2013.01); *H03F 2200/451* (2013.01)

(58) Field of Classification Search
CPC ........ H03F 3/19; H03F 1/56; H03F 2200/294; H03F 2200/387; H03F 2200/451; H04B 1/40

See application file for complete search history.

(56) References Cited

U.S. PATENT DOCUMENTS

| | | | |
|---|---|---|---|
| 10,193,580 B2* | 1/2019 | Patel | H03F 3/245 |
| 11,777,549 B2* | 10/2023 | Cho | H04J 4/00 455/552.1 |
| 12,113,485 B2* | 10/2024 | Ayranci | H03F 1/0283 |
| 2018/0278277 A1* | 9/2018 | Patel | H04B 1/0067 |
| 2020/0076372 A1* | 3/2020 | Schroegendorfer | H04B 1/18 |

* cited by examiner

*Primary Examiner* — Hai V Nguyen
(74) *Attorney, Agent, or Firm* — Lando & Anastasi, LLP (57) ABSTRACT

Aspects of the disclosure include a wireless device comprising a module input to receive an input signal, a module output to provide an amplified output signal, a low-noise amplifier including an input amplification stage coupled to the input, and a plurality of output amplification stages switchably coupled to the input amplification stage, and a plurality of impedance-matching circuits, each impedance-matching circuit of the plurality of impedance-matching circuits having an input coupled to a respective output amplification stage and an output coupled to the module output.

19 Claims, 5 Drawing Sheets

BROADBAND LOW NOISE AMPLIFIER USING MULTIPLE CASCODE STAGES

CROSS-REFERENCE TO RELATED APPLICATIONS

This application claims priority under 35 U.S.C. § 119(e) to U.S. Provisional Application Ser. No. 63/226,251, titled "BROADBAND LOW NOISE AMPLIFIER USING MULTIPLE CASCODE STAGES," filed on Jul. 28, 2021, which is hereby incorporated by reference in its entirety.

BACKGROUND

1. Field of the Disclosure

At least one example in accordance with the present disclosure relates generally to amplifiers, such as low-noise amplifiers.

2. Discussion of Related Art

Electronic devices, such as mobile cellular devices, may exchange information with other electronic devices. A mobile cellular device may include an antenna to transmit and receive signals. Mobile cellular devices may include additional components and circuitry to process signals transmitted and received via the antenna. For example, a mobile cellular device may include one or more amplifiers to amplify a signal transmitted or received via the antenna.

SUMMARY

According to at least one aspect of the present disclosure, a wireless device is provided comprising a module input to receive an input signal, a module output to provide an amplified output signal, a low-noise amplifier including an input amplification stage coupled to the input, and a plurality of output amplification stages switchably coupled to the input amplification stage, and a plurality of impedance-matching circuits, each impedance-matching circuit of the plurality of impedance-matching circuits having an input coupled to a respective output amplification stage and an output coupled to the module output.

In some examples, the wireless device includes a cascode amplifier including the input amplification stage and an output amplification stage of the plurality of output amplification stages. In at least one example, the input amplification stage includes a common-source amplifier or a common-emitter amplifier. In various examples, each output amplification stage includes a common-gate amplifier or a common-base amplifier. In some examples, each impedance-matching circuit includes one or more resistive, inductive, or capacitive components configured to provide output-impedance matching. In at least one example, each impedance-matching circuit is configured to provide output-impedance matching for a respective frequency band of a plurality of frequency bands.

In various examples, the plurality of frequency bands includes an n77 frequency and an n79 frequency. In some examples, the wireless device includes a controller configured to couple the input amplification stage to a respective impedance-matching circuit of the plurality of impedance-matching circuits based on a frequency of the input signal. In at least one example, the wireless device includes a signal switching device having at least one input coupled to the plurality of output amplification stages and an output coupled to the module output. In various examples, the signal switching device is configured to couple a selected output amplification stage to the module output. In some examples, the selected output amplification stage is selected based on a frequency of the input signal.

According to at least one aspect of the disclosure, a method of controlling a wireless device having a module input, a module output, an input amplification stage coupled to the module input, and a plurality of impedance-matching circuits coupled to the module output and switchably coupled to the input amplification stage is provided, the method comprising receiving an input signal at the input amplification stage from the module input, selecting an impedance-matching circuit of the plurality of impedance-matching circuits, providing the input signal from the input amplification stage to the selected impedance-matching circuit, and providing the input signal from the selected impedance-matching circuit to the module output.

In some examples, the method includes determining a frequency of the input signal. In various examples, selecting the impedance-matching circuit is based on the frequency of the input signal. In at least one example, each impedance-matching circuit is configured to match an impedance of a signal within a respective frequency band of a plurality of frequency bands. In some examples, the plurality of frequency bands includes an n77 frequency and an n79 frequency. In various examples, the wireless device includes a plurality of output amplification stages, each output amplification stage being coupled to a respective impedance-matching circuit of the plurality of impedance-matching circuits, and selecting the impedance-matching circuit includes coupling a corresponding output amplification stage to the input amplification stage.

According to at least one aspect of the disclosure, a wireless device comprising a low-noise amplifier (LNA) configured to receive an input signal and amplify the input signal to produce an amplified output signal, and an output-impedance-matching network having a plurality of impedance-matching circuits, wherein the LNA is configured to provide the amplified output signal to an impedance-matching circuit of the plurality of impedance-matching circuits.

In some examples, the LNA is configured to provide the amplified output signal to the impedance-matching circuit based on a frequency of the input signal. In at least one example, the LNA includes a cascode amplifier.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Electrical devices may include amplifiers, such as low-noise amplifiers. Amplifiers receive an input signal at an input, amplify the input signal based upon a gain value, and output an amplified output signal at an output based upon the input signal and the gain value. The power-amplifier input and power-amplifier output may each be coupled to an impedance-matching network, respectively referred to as an input matching network (IMN) and an output matching network (OMN). The impedance-matching networks match an impedance appearing at the respective connections to increase power transfer and/or decrease signal reflection. For example, an OMN may match an impedance appearing at an output connection of the amplifier.

Impedance-matching networks may include one or more resistive, capacitive, and/or inductive components. The components may be selected and arranged based upon a respective application to provide the desired impedance matching. For example, an amplifier configured to output a signal at a particular frequency may include or be coupled to an OMN having an impedance based on the particular frequency.

Amplifiers may be configured to output signals at multiple frequencies. The impedance transfer function of an OMN may be selected based on a frequency of the output signal. An OMN impedance matched to an output signal having one frequency may not be matched to an output signal having a different frequency. As understood by those in the art, the impedance of inductive and capacitive components varies based on a frequency of a signal. The impedance transfer function of an OMN for a signal of one frequency may therefore be different from the impedance transfer function of the same OMN for a signal of a different frequency. For example, an amplifier configured to amplify radio-frequency (RF) signals may have an OMN that is matched to a 3.7 GHz (in the n77 band) signal, but that is not matched to a 4.5 GHz (in the n79 band) signal.

In some examples, a matching network may have a programmable impedance transfer function. For example, the matching network may include one or more capacitors, inductors, and/or resistors that are switchable in and out of a conductive path such that an impedance of the matching network may be modulated. However, it may be difficult to tune the matching network, and such a tunable matching network may implement lossy components, such as lossy inductors. Furthermore, switching devices implemented to enable the tuning process may result in higher losses and a lower quality factor.

Examples of the disclosure include amplifiers having multiple signal paths. Each signal path may correspond to a respective output-signal frequency. Each signal path may include an impedance-matching network, such as an OMN, corresponding to the respective output-signal frequency. The amplifier may select an appropriate signal path based on a frequency of an input signal. Examples of the disclosure therefore include amplifiers capable of matching an impedance of any of several different output-signal frequencies, such as frequencies in the n77 and n79 bands.

Examples of the disclosure may be implemented in connection with amplifiers in many types of electronic devices or systems, such as consumer electronics (for example, televisions, gaming consoles, personal computers, tablet computers, desktop computers, and so forth), vehicles, communication equipment, electrical-utility equipment, or other devices or systems having amplifiers. For purposes of explanation, examples are provided with reference to wireless devices. For example, the wireless device may include a mobile telephone, such as a smartphone. However, it is to be appreciated that the principles of the disclosure are more broadly applicable to amplifiers in any of various devices or systems, and that wireless devices are described for purposes of example only.

Figure 1:
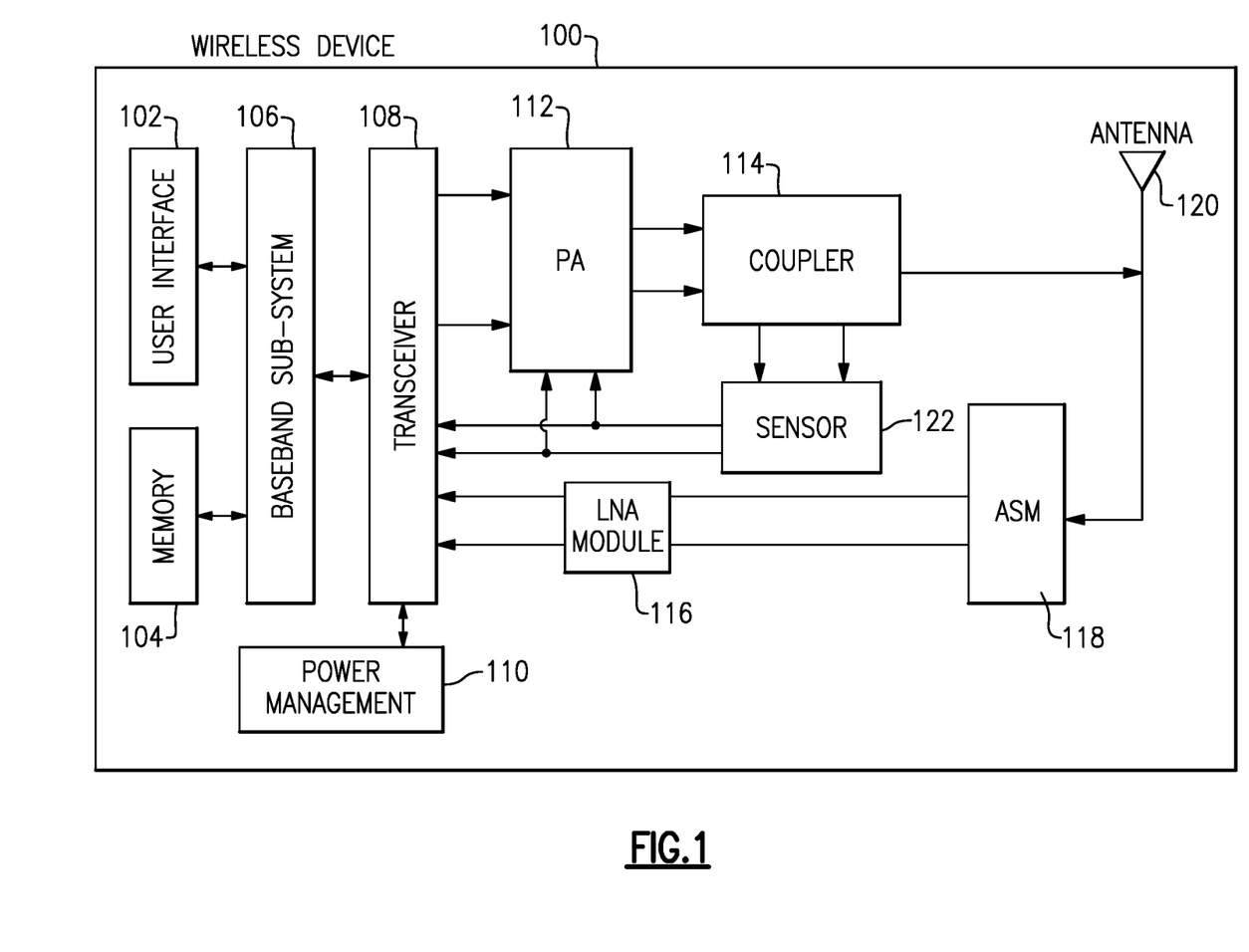
FIG. 1 illustrates a block diagram of a wireless device according to an example.

FIG. 1 illustrates a block diagram of a wireless device 100 according to an example. The wireless device 100 can be a cellular phone, smart phone, tablet, modem, communication network or any other portable or non-portable device configured for voice and/or data communication. The wireless device 100 includes a user interface 102, memory and/or storage 104, a baseband sub-system 106, a transceiver 108, a power-management system 110, a power-amplifier (PA) module 112, a coupler 114, a low-noise amplifier (LNA) module 116, a switching circuit 118 (also referred to as an antenna switch module [ASM]), an antenna 120, and at least one sensor 122.

The antenna 120 is configured to transmit and/or receive one or more signals, such that the wireless device 100 may communicate with one or more external devices via the antenna 120. The transceiver 108 is configured to generate signals for transmission and/or to process received signals. In some embodiments, transmission and reception functionalities can be implemented in separate components (for example, a transmit module and a receiving module) or be implemented in the same module.

Signals generated for transmission are provided from the transceiver 108 to the PA module 112, which amplifies the generated signals from the transceiver 108. As will be appreciated by those skilled in the art, the PA module 112 can include one or more power amplifiers. The PA module 112 can be used to amplify a wide variety of radio-frequency (RF) or other frequency-band transmission signals, including 5G signals. For example, the PA module 112 can receive an enable signal that can be used to pulse the output of the power amplifier to aid in transmitting a wireless local-area-network (WLAN) signal or any other suitable signal. The PA module 112 can be configured to amplify any of a variety of types of signal, including, for example, 5G signals, a Global System for Mobile (GSM) signal, a code-division multiple-access (CDMA) signal, a W-CDMA signal, a Long-Term-Evolution (LTE) signal, or an EDGE signal. In certain embodiments, the PA module 112 and associated components including switches and the like can be fabricated on GaAs substrates using, for example, pHEMT or BiFET transistors, or on a silicon substrate using CMOS transistors. The wireless device 100 also includes the LNA module 116, which may include one or more amplifier stages configured to amplify received signals in a similar or different manner as power amplifier(s) of the PA module 112. In at least one example, the LNA module 116 may include one or more LNAs each coupled to a respective IMN and/or OMN.

The wireless device 100 also includes the switching circuit 118, which is configured to switch between different bands and/or modes. For example, the switching circuit 118 may be configured to couple the LNA module 116 to the antenna 120 in a receive mode of operation and to decouple the LNA module 116 from the antenna 120 in a transmit mode of operation. In some examples, the LNA module 116 includes multiple LNAs, and the switching circuit 118 may be configured to couple or decouple one or more of the LNAs to the antenna 120. Similarly, the PA module 112 is coupled to the antenna 120 such that signals provided to the antenna 120 from the PA module 112 in the transmit mode of operation bypass the receive path (and switching circuit 118) of the wireless device 100.

Accordingly, in certain embodiments the antenna 120 can both receive signals that are provided to the transceiver 108 via the switching circuit 118 and the LNA module 116 and also transmit signals from the wireless device 100 via the transceiver 108, the PA module 112, and the coupler 114. However, in other examples multiple antennas can be used for different modes of operation.

The power-management system 110 is connected to the transceiver 108 and is configured to manage the power for the operation of the wireless device 100. The power-management system 110 can also control the operation of the wireless device 100, such as by controlling components of power amplifier(s) of the PA module 112 and/or LNA module 116. The power-management system 110 can include, or can be connected to, a battery that supplies power for the various components of the wireless device 100. The power-management system 110 can further include one or more processors or controllers that can control the transmission of signals and can also configure components of the wireless device 100 based upon the frequency of the signals being transmitted or received, for example. In addition, the processor(s) or controller(s) of the power-management system 110 may provide control signals to actuate switches, tune components, or otherwise configure components of the wireless device 100, such as components of the PA module 112 and/or LNA module 116, as discussed below. In at least one embodiment, the processor(s) or controller(s) of the power-management system 110 can also provide control signals to control the switching circuit 118 to operate in the transmit or receive mode.

In one embodiment, the baseband sub-system 106 is connected to the user interface 102 to facilitate various input and output of voice and/or data provided to and received from the user. The baseband sub-system 106 can also be connected to the memory and/or storage 104 which is configured to store data and/or instructions to facilitate the operation of the wireless device, and/or to provide storage of information for the user.

The wireless device 100 also includes the coupler 114 having one or more coupler sections for measuring transmitted power signals from the PA module 112 and for providing one or more coupled signals to at least one sensor 122. In some examples, the coupler 114 is further configured to measure signals from the LNA module 116. In various examples, the wireless device 100 includes one or more couplers in addition to, or in lieu of, the coupler 114 to measure transmitted power signals from the LNA module 116.

The at least one sensor 122 can in turn send information to the transceiver 108, power-management system 110, and/or directly to the PA module 112 and/or LNA module 116 as feedback for making adjustments to regulate the power level of the PA module 112 and/or LNA module 116. In this way the coupler 114 can be used to boost/decrease the power of a transmission signal having a relatively low/high power. It will be appreciated, however, that the coupler 114 can be used in a variety of other implementations.

For example, in certain embodiments in which the wireless device 100 is a mobile phone having a time division multiple access (TDMA) architecture, the coupler 114 can advantageously manage the amplification of an RF transmitted power signal from the PA module 112 and/or LNA module 116. In a mobile phone having a TDMA architecture, such as those found in GSM, CDMA, and W-CDMA systems, the PA module 112 can be used to shift power envelopes up and down within prescribed limits of power versus time. For instance, a particular mobile phone can be assigned a transmission time slot for a particular frequency channel. In this case the PA module 112 and/or LNA module 116 can be employed to aid in regulating the power level one or more RF power signals over time, so as to prevent signal interference from transmission during an assigned receive time slot and to reduce power consumption. In such systems, the coupler 114 can be used to measure the power of a power-amplifier output signal to aid in controlling the PA module 112 and/or LNA module 116, as discussed above.

The wireless device 100 may be configured to transmit and/or receive signals of various frequencies, such as 3.7 GHz (n77), 4.5 GHz (n79), and so forth. As discussed above, received signals of the various frequencies may be provided to the LNA module 116 by the antenna 120. The LNA module 116 amplifies a received signal and provides it to the transceiver 108.

Figure 2:
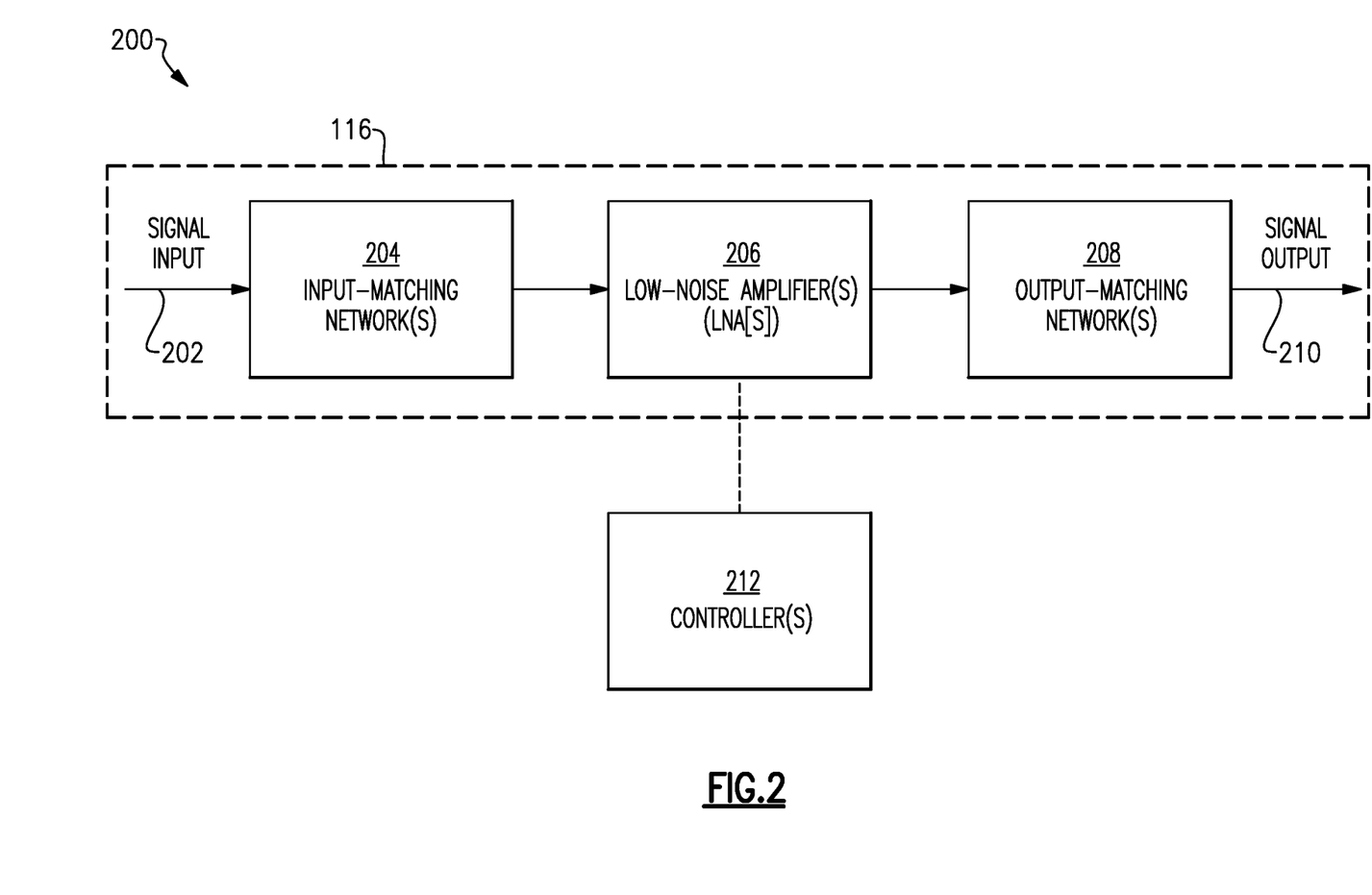
FIG. 2 illustrates a block diagram of a low-noise-amplifier (LNA) module according to an example.

FIG. 2 illustrates a block diagram 200 of aspects of the wireless device 100 including the LNA module 116 according to an example. The LNA module 116 includes a signal input 202, at least one input-matching network 204 ("IMN 204"), at least one low-noise amplifier 206 ("LNA 206"), at least one output-matching network 208 ("OMN 208"), and a signal output 210. The LNA module 116 is coupled to at least one controller 212 ("controller 212"). For example, as discussed above, the power-management system 110 may include one or more controllers, which may include the controller 212.

The signal input 202 is coupled to the IMN 204, and is configured to be coupled to a source of an input signal, such as the switching circuit 118. The IMN 204 is coupled to the signal input 202 and to the LNA 206. The LNA 206 is coupled to the IMN 204 and to the OMN 208, and is communicatively coupled to the controller 212. The OMN 208 is coupled to the LNA 206 and to the signal output 210. The signal output 210 is coupled to the OMN 208 and to at least one component to receive an output signal, such as the transceiver 108. The controller 212 is communicatively coupled to the LNA 206

The signal input 202 receives an input signal from a source (for example, the switching circuit 118), and provides the input signal to the IMN 204. For example, the input signal may be an RF signal. The RF signal may have any of various frequencies including, for example, 3.7 GHz (n77), 4.5 GHz (n79), and so forth. The IMN 204 may be configured to substantially match an impedance of a source of the input signal. The IMN 204 provides the signal to the LNA 206.

The LNA 206 amplifies the received signal, and provides the amplified signal to the OMN 208. The LNA 206 may include one or more LNAs. In some examples, the LNA 206 includes multiple signal paths each including one or more power-amplification components. For example, the LNA 206 may include an input stage of an LNA coupled to multiple signal paths. Each signal path may include an output stage of an LNA. Each signal path may correspond to a respective signal frequency. The input stage of the LNA may be coupled to one or more of the output stages to amplify at least one signal received at the input stage. The controller 212 may control operation of the LNA 206, such as by providing a selection signal to the LNA 206 to select a signal path to amplify the at least one signal.

The OMN 208 receives the amplified signal from the LNA 206 and provides the amplified signal to the signal output 210. The OMN 208 may be configured to substantially match an impedance of a load to which the amplified signal is provided. In one example, the OMN 208 includes multiple matching networks. Each matching network may be implemented in a respective one of the multiple signal paths. Each matching network may therefore provide impedance matching for a signal in the respective signal path.

As discussed above, an impedance transfer function of an impedance-matching network may vary based on a frequency of a signal conducted by the impedance-matching network. Accordingly, each matching network in the signal paths may correspond to a respective signal frequency, and may provide impedance matching based on the signal frequency. For example, a first matching network in a first signal path may provide impedance matching for a signal of a first frequency (for example, a 3.7 GHz signal), and a second matching network in a second signal path may provide impedance matching for a signal of a second frequency (for example, a 4.5 GHz signal).

The respective matching network provides the amplified output signal to the signal output 210. The signal output 210 provides the amplified signal received from the OMN 208 to a load, such as the transceiver 108.

Figure 3:
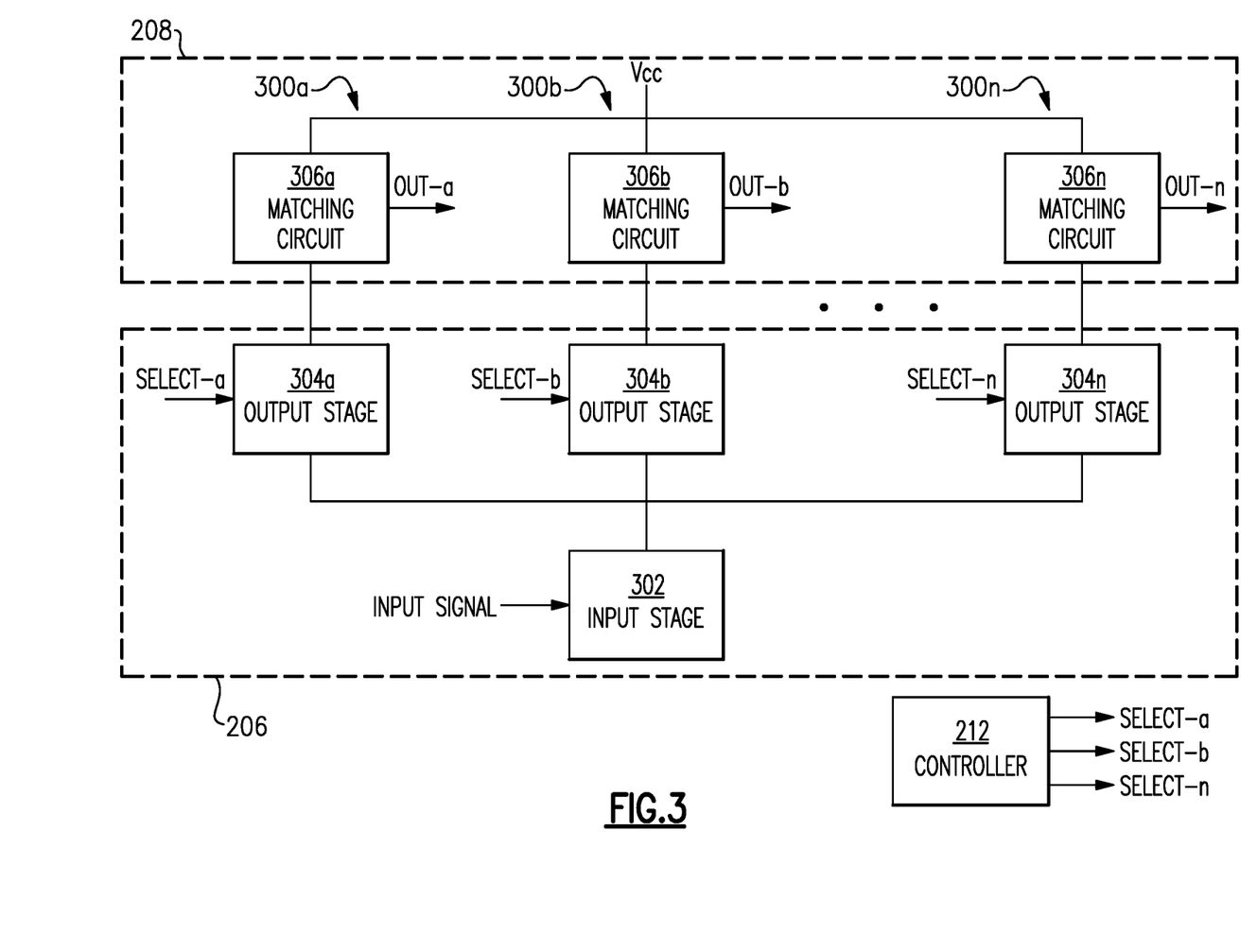
FIG. 3 illustrates a block diagram including components of the LNA module according to an example.

FIG. 3 illustrates a block diagram of aspects of the LNA module 116 including the LNA 206, the OMN 208, and the controller 212 according to an example. The LNA 206 and the OMN 208 include a plurality of signal paths 300, including a first signal path 300a, a second signal path 300b, and at least one third signal path 300n. It is to be appreciated that the plurality of signal paths 300 is illustrated as including three signal paths for purposes of explanation only. In some examples, the plurality of signal paths 300 may instead include a single signal path, two signal paths, four or more signal paths, and so forth.

The LNA 206 includes an input stage 302, and further includes a first output stage 304a in the first signal path 300a, a second output stage 304b in the second signal path 300b, and at least one third output stage 304n in the at least one third signal path 300n. The LNA 206 may be implemented as a cascode amplifier including the input stage 302 and at least one of the output stages 304. A cascode amplifier may include a common-source or common-emitter amplifier as an input stage, and a common-gate or common-base amplifier as an output stage. Accordingly, the input stage 302 may include a common-source or common-emitter amplifier. Each of the output stages 304 may include a common-gate or common-base amplifier.

The OMN 208 includes a first matching circuit 306a in the first signal path 300a, a second matching circuit 306b in the second signal path 300b, and at least one third matching circuit 306n in the at least one third signal path 300n. Each of the matching circuits 306 may exhibit an impedance transfer function matched to a signal that a respective one of the signal paths 300 is configured to receive. Accordingly, providing multiple matching circuits 306 advantageously improves impedance matching while avoiding lossy switchable matching components.

The input stage 302 is coupled to each of the output stages 304, and is coupled to an input-signal source, such as the IMN 204. Each of the output stages 304 is coupled to the input stage 302 and a respective one of the matching circuits 306. Each of the output stages 304 is communicatively coupled to the controller 212, and is configured to receive a select signal from the controller 212. For example, the controller 212 may send a select signal to an output stage that is to amplify an input signal received at the input stage 302. An output stage that receives a select signal may be electrically coupled to the input stage 302 and configured to receive, and amplify, a signal received from the input stage 302.

The matching circuits 306 are each coupled to a respective one of the output stages 304, and are coupled to a voltage source $V_{cc}$. The matching circuits 306 may each be coupled to, and configured to provide a respective output signal to, an output switching circuit, which is omitted for purposes of clarity. The output switching circuit may receive at least one output signal from the matching circuits 306 and provide the at least one output signal to the signal output 210.

Figure 4:
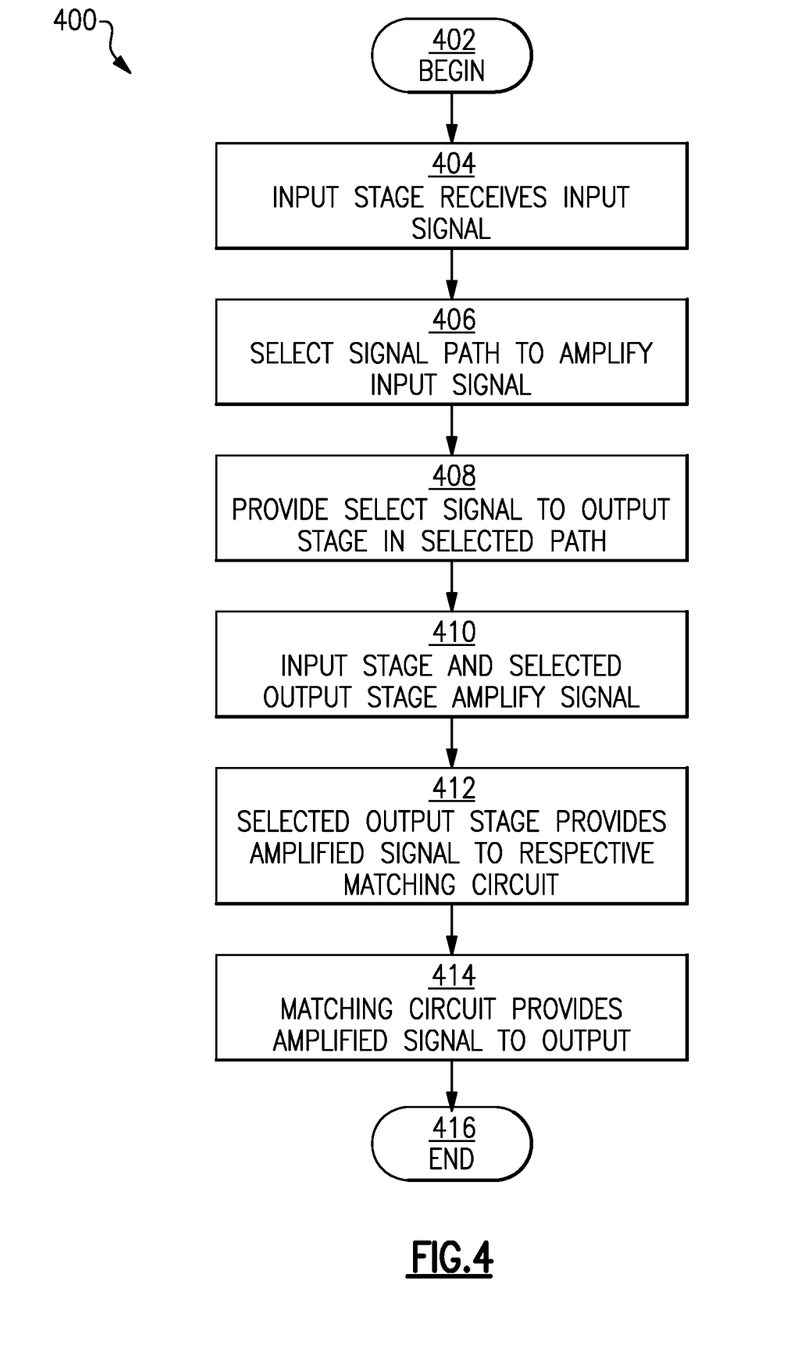
FIG. 4 illustrates a process of operating components of the LNA module according to an example.

FIG. 4 illustrates a process 400 of operating the LNA 206 and the OMN 208 according to an example.

At act 402, the process 400 begins.

At act 404, the input stage 302 receives an input signal. For example, the input signal may be received from the IMN 204.

At act 406, a signal path of the signal paths 300 is selected to amplify the input signal. The controller 212 may select the signal path. The controller 212 may select the signal path based on parameters of the input signal. For example, the controller 212 may select the signal path based on a frequency of the input signal. Each of the signal paths 300 may correspond to a respective frequency, and the controller 212 may select the signal path corresponding to the frequency of the input signal. For example, one of the signal paths 300 may correspond to an input signal at 3.7 GHz, another of the signal paths 300 may correspond to an input signal of 4.5 GHz, and so forth.

At act 408, the controller 212 provides a select signal to a respective output stage corresponding to the signal path selected at act 406. For example, if the first signal path 300a is selected at act 406, act 408 may include the controller 212 providing select signal Select-a to the first output stage 304a. Providing the select signal to the respective output stage may control or enable the output stage to receive and amplify the input signal received at the input stage 302.

At act 410, the input stage 302 and selected output stage amplify the input signal. In one example, the input stage 302 and the selected one of the output stages 304 may form a cascode amplifier. For example, the input stage 302 and the first output stage 304a may form a cascode amplifier.

At act 412, the output stage provides the amplified input signal to a respective matching circuit corresponding to the signal path selected at act 406. For example, if the first signal path 300a is selected at act 406, act 412 may include the first output stage 304a providing the amplified input signal to the first matching circuit 306a. The matching circuit provides impedance matching to minimize power loss and/or signal reflections of the amplified input signal. As discussed above, the matching circuit may provide impedance matching based on the frequency of the amplified input signal. For example, the matching circuit may include components that, when presented with a signal of a frequency corresponding to the respective signal path, exhibit an impedance that matches a load of the signal.

At act 414, the matching circuit provides an amplified output signal to an output. In one example, the matching circuit may provide the amplified output signal to the signal output 210. For example, the first matching circuit 306a may provide an amplified output signal Out-a to the signal output 210. In another example, at least one switching circuit may be implemented between the matching circuits 306 and the signal output 210. For example, the at least one switching device may be configured to couple the signal output 210 to the matching circuit providing the amplified output signal. The controller 212 may provide one or more control signals to the at least one switching device to control the at least one switching device to couple the signal output 210 to the matching circuit providing the amplified output signal.

At act 416, the process 400 ends. However, it is to be appreciated that the process 400 may be repeatedly executed and/or return to act 404 from act 414.

The LNA 206 may therefore include an input stage and an output stage, such as a common-source or common-emitter stage and a common-gate or common-base stage in a cascode amplifier. The input stage may be selectively coupled to any of several signal paths based on, for example, parameters of a signal to be amplified. Each signal path may include an output stage and at least one matching network matched to the parameters of the signal, such as a frequency of the signal. Accordingly, example amplifiers may provide improved impedance matching across several different frequency bands.

Figure 5:
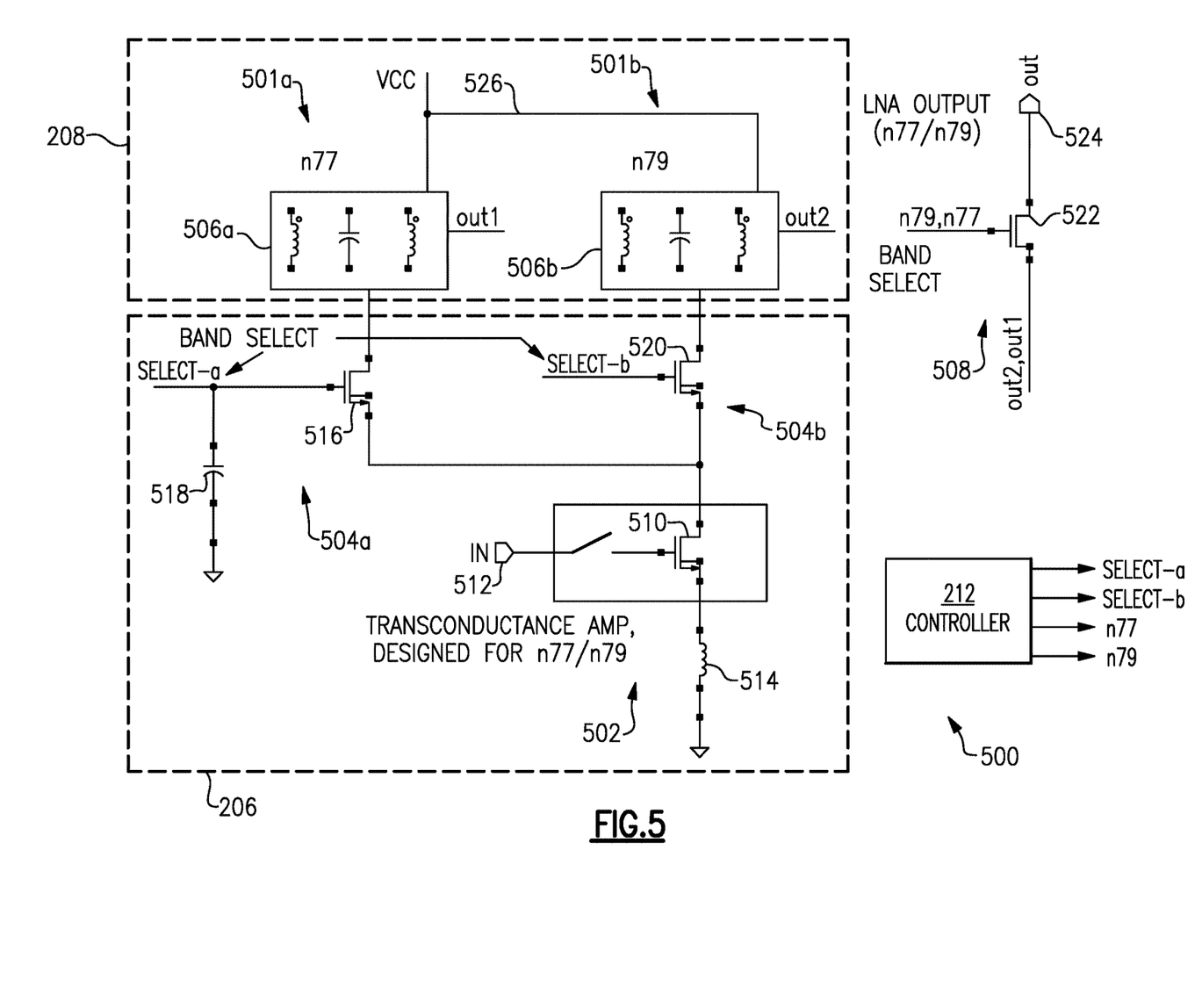
FIG. 5 illustrates a schematic diagram including components of the LNA module according to an example.

FIG. 5 illustrates a schematic diagram including the LNA 206 and the OMN 208 according to an example. The schematic diagram includes a first signal path 501a and a second signal path 501b, which may be examples of the plurality of signal paths 300. The LNA 206 includes a power-amplifier input stage 502 ("input stage 502"), a first power-amplifier output stage 504a ("first output stage 504a"), and a second power-amplifier output stage 504b ("second output stage 504b"). The input stage 502 may be an example of the input stage 302. The output stages 504 may be examples of the output stages 304. The OMN 208 includes a first matching circuit 506a and a second matching circuit 506b. The matching circuits 506 may be examples of the matching circuit 306. The schematic diagram 500 further includes the controller 212 and a signal-switching stage 508.

The input stage 502 includes an input switching device 510, a signal input 512, and an inductive element 514. The first output stage 504a includes a first output switching device 516, which may act as a first common-gate stage, and a capacitive element 518. The second output stage 504b includes a second output switching device 520, which may act as a second common-gate stage, and a capacitive element which is similar to the capacitive element 518, but which is omitted for purposes of clarity. The first matching circuit 506a and the second matching circuit 506b include one or more capacitive, inductive, and/or resistive elements arranged in any of various parallel and/or series configurations, such as an LC circuit, CL circuit, LCLC circuit, and so forth. A number, type, and/or arrangement of the components of the matching circuits 506 may be selected based on parameters of an input signal, such as input-signal frequency, as discussed above. Accordingly, the first matching circuit 506a may include one or more capacitive, inductive, and/or resistive elements having a different arrangement and/or values as compared to one or more capacitive, inductive, and/or resistive elements of the second matching circuit 506b, such that the impedance of the first matching circuit 506a differs from the impedance of the second matching circuit 506b. Providing multiple matching circuits 506 may advantageously improve performance of the OMN 208. For example, rather than a single matching circuit being matched to a broad frequency band, multiple matching circuits may be matched to narrower bands encompasses by the broad frequency band and thereby provide a better match and higher gain than the single matching circuit. The signal-switching stage 508 includes a signal switching device 522 and at least one signal output 524 ("signal output 524").

In one example, the input switching device 510 may include a metal-oxide-semiconductor field-effect transistor (MOSFET), although in other examples the input switching device 510 may include other switching elements, such as bipolar-junction transistors (BJTs) or other switching elements. In the example illustrated in the schematic diagram 500, the input switching device 510 includes a source coupled to the inductive element 514, a drain coupled to the first output switching device 516 and the second output switching device 520, and a gate switchably coupled to the signal input 512. The signal input 512 is switchably coupled to the gate of the input switching device 510, and is configured to be coupled to a source of an input signal, such as the IMN 204. The inductive element 514 is coupled to the input switching device 510 at a first connection, and is coupled to a reference node (for example, a neutral node or ground) at a second connection.

In one example, the first output switching device 516 may include a MOSFET, BJT, or other switching element. In the example illustrated in the schematic diagram 500, the first output switching device 516 includes a source coupled to the input switching device 510, a drain coupled to the first matching circuit 506a, and a gate coupled to the capacitive element 518. In various examples, the gate of the first output switching device 516 is communicatively coupled to the controller 212. The capacitive element 518 is coupled to the gate of the first output switching device 516 at a first connection, and is coupled to a reference node (for example, a neutral node or ground) at a second connection.

In one example, the second output switching device 520 may include a MOSFET, BJT, or other switching element. In the example illustrated in the schematic diagram 500, the second output switching device 520 includes a source coupled to the input switching device 510, a drain coupled to the second matching circuit 506b, and a gate communicatively coupled to the controller 212. In various examples, the gate may be coupled to a capacitive element in a substantially similar manner as the first output switching device 516 to the capacitive element 518. The capacitive element may be coupled to the gate of the second output switching device 520 at a first connection and a reference node (for example, a neutral node or ground) at a second connection.

The first matching circuit 506a is coupled to the first output switching device 516, the signal-switching stage 508, and a supply-voltage node 526. As discussed above, the first matching circuit 506a may include a combination of resistive, inductive, and/or capacitive elements coupled in any of various configurations. One or more of the elements of the first matching circuit 506a may be coupled to the first output switching device 516, the signal-switching stage 508, and/or the supply-voltage node 526 depending at least in part on a configuration of the elements of the first matching circuit 506a.

The second matching circuit 506b is coupled to the second output switching device 520, the signal-switching stage 508, and the supply-voltage node 526. As discussed above, the second matching circuit 506b may include a combination of resistive, inductive, and/or capacitive elements coupled in any of various configurations. One or more of the elements of the second matching circuit 506b may be coupled to the second output switching device 520, the signal-switching stage 508, and/or the supply-voltage node 526 depending at least in part on a configuration of the elements of the second matching circuit 506b.

In one example, the signal switching device 522 may include a MOSFET, BJT, or other switching element. In the example illustrated in the schematic diagram 500, the signal switching device 522 includes a source coupled to an output connection of each of the matching circuits 506, a drain coupled to the signal output 524, and a gate coupled to the controller. In some examples, the signal switching device 522 includes multiple switching devices. For example, the signal switching device 522 may include a first switching device having a source coupled to the output connection of the first matching circuit 506a, a drain coupled to the signal output 524, and a gate coupled to the controller 212 to receive a first selection signal, and a second switching device having a source coupled to the output connection of the second matching circuit 506b, a drain coupled to the signal output 524, and a gate coupled to the controller 212 to receive a second selection signal. In still other examples, the signal switching device 522 may include another type of switching device configured to connect one, both, or neither of the output connections of the matching circuits 506 to the signal output 524.

The signal output 524 is coupled to the drain of the signal switching device 522, and is configured to be coupled to, and provide an output signal to, a load. For example, the signal output 524 may provide the output signal to the signal output 210 which may provide the output signal to the transceiver 108, as discussed above.

An example of the process 400 will be provided with respect to the schematic diagram 500.

At act 404, the input stage 502 receives an input signal. For example, an input signal may be received at the signal input 512 and provided to the gate of the input switching device 510. The input signal may be received from the IMN 204, for example.

At act 406, a signal path of the signal paths 501 is selected to amplify the input signal received at the signal input 512. As discussed above, each signal path may correspond to a respective signal frequency. In one example, the first signal path 501a corresponds to a signal frequency of approximately 3.7 GHz (n77), and the second signal path 501b corresponds to a signal frequency of approximately 4.5 GHz (n79). Accordingly, if the input signal received at the signal input 512 is an n77 signal, the first signal path 501a may be selected to amplify the input signal. Otherwise, if the input signal received at the signal input 512 is an n79 signal, the second signal path 501b may be selected to amplify the input signal. As discussed below, the first matching circuit 506a may be designed to provide impedance matching to a signal of an n77 frequency, and the second matching circuit 506b may be designed to provide optimal impedance matching to a signal of an n79 frequency. For purposes of example, the input signal is an n77 signal and the first signal path 501a is selected to amplify the input signal.

At act 408, the controller 212 provides a first-signal-path-selection signal Select-a to the gate of the first output switching device 516 to couple the input switching device 510 to the first output switching device 516. As discussed above, coupling the first output switching device 516 to the input switching device 510 forms a cascode amplifier in which the input switching device 510 acts as a common-source amplifier and the first output switching device 516 acts as a common-gate amplifier to amplify the input signal received at the signal input 512. Act 408 may further include providing a first switching signal to a gate of the signal switching device 522 to enable a signal provided by the first signal path 501a to the source of the signal switching device 522 to be provided to the signal output 524.

At act 410, the input stage 502 and the first output stage 504a amplify the input signal received at the signal input 512. As discussed above, at least the input switching device 510 and the first output switching device 516 may form a cascode amplifier to amplify the input signal received at the signal input 512.

At act 412, the first output stage 504a provides the amplified signal to the first matching circuit 506a. The first matching circuit 506a provides output-impedance matching for the amplified signal. The first matching circuit 506a may have a combination of resistive, inductive, and/or capacitive components to match a signal at an n77 frequency, such that impedance matching is optimized for parameters of the input signal.

At act 414, the first matching circuit 506a provides the signal to the signal switching device 522. As discussed above, the controller 212 may be configured to provide a control signal n77 to the gate of the signal switching device 522 to couple the source of the signal switching device 522 to the signal output 524. Accordingly, the first matching circuit 506a may provide the signal to the signal output 524 via the signal switching device 522.

As discussed above, the signal switching device 522 may include multiple switching devices each coupled to a respective one of the matching circuits 506, and the controller 212 may control a respective switching device to couple the signal output 524 to a respective one of the matching circuits 506. In another example, the signal switching device 522 may include a signal switching device having an output coupled to the signal output 524 and a plurality of inputs, each coupled to a respective one of the matching circuits 506, and the controller 212 may control the signal switching device 522 to couple a respective one of the plurality of inputs to the output. In other examples, the signal switching device 522 includes a signal switching device 522 having an output coupled to the signal output 524 and an input coupled to each of the matching circuits 506. In another example, the signal switching device 522 may be omitted, and the matching circuits 506 may be coupled directly to the signal output 524.

The schematic diagram 500 provides one example of components of the LNA module 116. In alternate examples, the LNA module 116 may include more than two signal paths. In various examples, each signal path of the LNA module 116 may include a respective matching circuit. Each signal path may be configured to receive and amplify an input signal at a certain frequency or range of frequencies. Each signal path may include a matching circuit configured to provide optimal or near-optimal impedance matching for the respective frequency or range of frequencies. In some examples, one or more of the matching circuits may be adjustable, such as by having one or more resistive, capacitive, and/or inductive components capable of being switched in or out.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A wireless device comprising:
a module input to receive an input signal;
a module output to provide an amplified output signal;
a low-noise amplifier including
an input amplification stage coupled to the module input, and
a plurality of output amplification stages switchably coupled to the input amplification stage;
a plurality of impedance-matching circuits, each impedance-matching circuit of the plurality of impedance-matching circuits having an input coupled to a respective output amplification stage and an output coupled to the module output; and
a signal switching device having an input coupled to the plurality of output amplification stages and to receive at least one signal from the plurality of output amplification stages, the at least one signal including the amplified output signal, the signal switching device further having an output coupled to the module output and configured to provide the amplified output signal of the at least one signal received at the input of the signal switching device to the module output.

2. The wireless device of claim 1 further comprising a cascode amplifier including the input amplification stage and an output amplification stage of the plurality of output amplification stages.

3. The wireless device of claim 2 wherein the input amplification stage includes a common-source amplifier or a common-emitter amplifier.

4. The wireless device of claim 3 wherein each output amplification stage includes a common-gate amplifier or a common-base amplifier.

5. The wireless device of claim 1 wherein each impedance-matching circuit includes one or more resistive, inductive, or capacitive components configured to provide output-impedance matching.

6. The wireless device of claim 5 wherein each impedance-matching circuit is configured to provide output-impedance matching for a respective frequency band of a plurality of frequency bands.

7. The wireless device of claim 6 wherein the plurality of frequency bands includes an n77 frequency and an n79 frequency.

8. The wireless device of claim 6 further comprising a controller configured to couple the input amplification stage to a respective impedance-matching circuit of the plurality of impedance-matching circuits based on a frequency of the input signal.

9. The wireless device of claim 1 wherein the signal switching device is configured to couple a selected output amplification stage to the module output.

10. The wireless device of claim 9 wherein the selected output amplification stage is selected based on a frequency of the input signal.

11. A method of controlling a wireless device having a module input, a module output, an input amplification stage coupled to the module input, a plurality of impedance-matching circuits coupled to the module output and switchably coupled to the input amplification stage, and a signal switching device coupled between the plurality of impedance-matching circuits and the module output, the method comprising:
receiving an input signal at the input amplification stage from the module input;
selecting an impedance-matching circuit of the plurality of impedance-matching circuits;
providing the input signal from the input amplification stage to the selected impedance-matching circuit;
providing the input signal from the selected impedance-matching circuit to the signal switching device; and
providing, by the signal switching device, the input signal to the module output.

12. The method of claim 11 further comprising determining a frequency of the input signal.

13. The method of claim 12 wherein selecting the impedance-matching circuit is based on the frequency of the input signal.

14. The method of claim 13 wherein each impedance-matching circuit is configured to match an impedance of a signal within a respective frequency band of a plurality of frequency bands.

15. The method of claim 14 wherein the plurality of frequency bands includes an n77 frequency and an n79 frequency.

16. The method of claim 11 wherein the wireless device includes a plurality of output amplification stages, each output amplification stage being coupled to a respective impedance-matching circuit of the plurality of impedance-matching circuits, and wherein selecting the impedance-matching circuit includes coupling a corresponding output amplification stage to the input amplification stage.

17. A wireless device comprising:
a low-noise amplifier (LNA) configured to receive an input signal and amplify the input signal to produce an amplified output signal;
an output-impedance-matching network having a plurality of impedance-matching circuits; and
a signal switching device coupled between each impedance-matching circuit of the plurality of impedance-matching circuits and a module output,
the LNA being configured to provide the amplified output signal to an impedance-matching circuit of the plurality of impedance-matching circuits, and the impedance-matching circuit being configured to provide the amplified output signal to the module output via the signal switching device.

18. The wireless device of claim 17 wherein the LNA is configured to provide the amplified output signal to the impedance-matching circuit based on a frequency of the input signal.

19. The wireless device of claim 17 wherein the LNA includes a cascode amplifier.

* * * * *